Oct. 21, 1969 H. SCHMID 3,474,440
DIGITAL-TO-ANALOG CONVERTER
Filed April 28, 1966
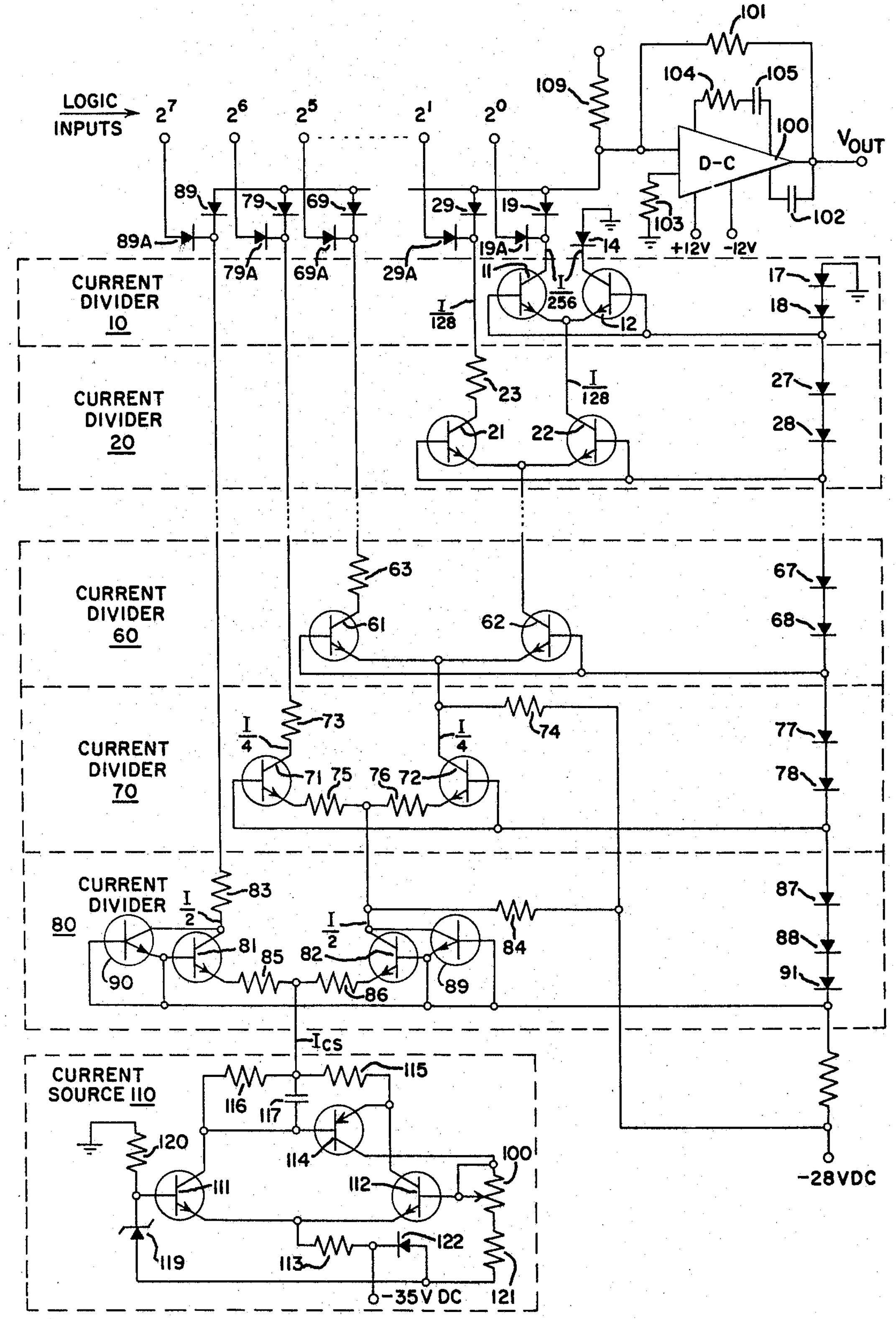

United States Patent Office 3,474,440

Patented Oct. 21, 1969

3,474,440

DIGITAL-TO-ANALOG CONVERTER

Hermann Schmid, Binghamton, N.Y., assignor to General Electric Company, a corporation of New York Filed Apr. 28, 1966, Ser. No. 546,101

Int. Cl. H03k 13/02

U.S. Cl. 340—347 10 Claims

ABSTRACT OF THE DISCLOSURE

A digital-to-analog converter employing a constant current source, differential amplifiers as current dividers, diodes as current switches and an operational amplifier to sum the currents and convert them to an analog voltage. There are $n$ differential amplifiers, one for each bit of the digital input signal, cascaded to divide the constant current I into the binary components $I/1$, $I/2$, $I/3$, etc. These current components are then selected by the diode switches, which are energized by the binary input signal.

This invention relates to electronic apparatus for generating an analog electrical signal that is proportional to an input set of binary electrical signals representing a variable information quantity. It is particularly useful for precision systems where it is important to minimize complexity and maximize the use of electronic packages having multiple components and/or integrated circuits.

A near universal requirement in control systems having digital electronic apparatus for data processing is the conversion of analog sensor signals to digital signals and/or the conversion of digital computer output signals into analog form for effecting control. Because these conversion functions are merely changing the signal from one code to another, they are nonproductive functions which are tolerated where it is determined that the advantages of digital data processing are worth the added cost, complexity, and information degradation in the conversions. It has therefore long been an obvious and well-known goal to provide the cheapest, simplest, and most accurate analog-to-digital and digital-to-analog converters in these and similar situations.

The normal way to convert digital to analog signals is with operational amplifiers using weighted current summing resistors, or resistor "ladder" networks, that are controlled by switches responsive to digital (binary) signals. Apparatus of this type constitutes a precision voltage source, a precision resistance network, a set of precision switches and a precision amplifier output circuit. it is an inherent problem that with the weighted resistor technique there are extreme resistance value variations and extreme load variations on the switches. For example, with a ten-bit input, the largest weighted resistor must be more than a thousand times the resistance of the smallest. A ten-bit "ladder" requires twenty precision resistors which have to be extremely carefully matched. Precision resistors are costly, awkward, impossible to produce in integrated circuit packages, and their precision is temperature dependent. Transistor voltage switches introduce errors both in the ON and the OFF conditions, are expensive, are difficult to drive from integrated circuits, are difficult to implement as monolithic integrated circuits, etc. For these and related reasons, the need for smaller, better, and cheaper digital-to-analog converters is well known.

The converter problems are aggravated with integrated circuits, particularly monolithic chips, where precision resistances must be externally provided. Also, with high-speed solid-state apparatus, it is generally necessary to use solid-state switches in the converters (operated by the digital input signals) for adequate operating speeds and compatibility. These switches, as a practical matter, are analog voltage switches which present very serious implementation problems because of solid-state p-n junction voltage drops and/or substantial ON resistance, and similar problems. Precision resistors, particularly for large resistances, generally have substantial inductance so that the rate at which digital signals can be converted is limited. Because a major advantage of digital data processing is the capability of making complex calculations rapidly, its application to control systems is limited in value without rapid data conversion.

Accordingly, it is an object of this invention to provide an improved digital-to-analog converter which is not primarily dependent upon precision resistances for precision operation.

It is a further object of this invention to provide a converter which is adaptable to integrated circuit or other classes of array fabrication processes.

It is another object of the invention to provide a digital-to-analog converter which obviates the switching problems such as speed and precision limitations with resistor networks.

Briefly stated, a digital-to-analog signal converter is provided that employs differential amplifiers as current dividers, diodes as current switches and an operational amplifier as a current to voltage converter. It has been discovered that accuracy is dependent upon matching of the transistors in the differential amplifier (the solid-state $\beta$ characteristic) and through simultaneous fabrication, selection, and compensation, precision operation is readily obtained. While a conventional operational amplifier with its precision feedback resistor is employed as formerly to produce an output D-C voltage, few, if any, additional precision resistors are necessary. It has been further discovered that conventional diode current switches can be used with the binary input signals and that the finite base currents in the differential amplifiers need not cause significant error.

The invention, together with further objects and advantages thereof, may best be understood by referring to the following description taken in conjunction with the appended drawings in which like numerals indicate like parts and in which:

The drawing is a schematic diagram of a preferred embodiment of the invention for eight-bit input signals.

In the illustrated embodiment, the constant (negative) current $I_{cs}$ from source 110 is split up through a set of current dividers 10, 20, . . . 60, 70, 80 to ground. One output of each divider 10–80 is fed to another divider and the other output is selectively switched either directly to ground or through an operational amplifier 100 input circuit to ground. A digitally selected fraction of the constant current $I_{cs}$ is applied to operational amplifier 100 which generates a balancing current through precision resistor 101, across which appears the desired output analog voltage signal. The converter is arranged so that the loading on constant current source 110 is substantially the same for all conditions of the series of current dividers 10–80 and their switches 19, 29, . . . 89.

The current divider 10 is a conventional differential amplifier structure which is operated in an unorthodox manner, more like a pair of common-base amplifiers. The transistors 11 and 12 are fabricated on the same substrate simultaneously so as to have nearly identical electrical characteristics. Accordingly, as the ambient temperature varies, their electrical characteristics remain equal, and they are said to "track" together. By coupling the base of transistor 11 to the base of transistor 12; connecting the emitter of transistor 11 to the emitter of transistor 12, and coupling the common source of current to both of these emitters, the transistors become parallel base-grounded amplifiers. If their beta characteristics (the fraction of the emitter injected minority carriers which arrive at the base barriers) are equal, and the emitter-base voltages are equal, the current is divided equally. Bias for the base-emitter junction is provided by the series pair of diodes 17 and 18. The p-n junctions of these diodes form convenient voltage drops. While resistors can be used, diodes offer a low impedance voltage source with good temperature tracking and diodes are usually easier to use, particularly in an integrated circuit array. The remaining current dividers are formed in the same manner as for transistors 21 and 22, through the transistor pairs to 61 and 62, 71 and 72, and 81 and 82. Resistors 23, . . . 63, 73 and 83 are selected to provide a matching load impedance for each side of the current dividers. The emitter resistors 75, 76, 85 and 86 minimize the effect of variations in the transistors' emitter-base junction characteristics, which is unnecessary for the lower dividers. When required by the selected transistors, additional diodes such as 91 provide the proper junction bias, which is not normally critical. Where extra precision is called for, the higher significant bit dividers can be augmented with auxiliary transistors 89 and 90 connected to the original transistors 81 and 82 as a Darlington circuit to increase the gain. That is, the collectors of 89 and 82 are connected together and the emitter of the second transistor 89 is connected to the base of the first 82.

Errors in the converter are produced by the finite base currents and by the differences in emitter currents. However, it has been found that with little compensation, presently available differential amplifiers will provide accuracies on the order of one part in two thousand. While the use of resistors 74, 84, coupled between the emitters and the bias source, in the higher orders may be necessary to compensate for the base currents, it is preferable to use Darlington connected transistor pairs to minimize the base currents (which are roughly inversely proportional to gain) since it is normally preferable to integrate as much of the converter structure onto a single semiconductor chip. This makes available large numbers of transistors and diodes at low cost per component. Furthermore, not only are the number of precision components minimal, the requirements are generally not for absolute precision values, but only precision matching by pairs.

The switches 19, 29, . . . 89 are of the type common to digital circuits. A "1" input is in the form of a slightly negative voltage, typically minus one volt, applied to diode 19A. This back biases diode 19A and permits the negative current to flow from current divider 10 into amplifier 100. The impedance effect of the forward conducting diode 19 is negligible and therefore does not affect the divided 10 output current. Because the cathode of diode 19 is near ground, back bias of diode 19A is assured, and with a small voltage on the anode of diode 19A, reverse leakage current is negligible. Similarly, with a "0" input, a small positive voltage (near ground) is applied to diode 19A with a reverse effect resulting. The "0" positive voltage acts as a current sink for the divider 10 negative current. Therefore, the negative divider current is diverted from the operational amplifier 100 and diode 19 is reverse-biased. The same operation is provided by diodes 29 and 29A for divider 20, and on, up to diodes 89 and 89A.

The operational amplifier 100 need only provide inverse high current gain so that the current through resistor 101 cancels the undiverted current from dividers 10–80. The resulting voltage drop across precision resistor 101 is thereby made the desired analog output voltage proportional to the digital input signal applied to switches 19, 29, . . . 89. Of course, where the utilization device can employ current signal directly, the sum of the divider currents can be employed directly, if the utilizing device input impedance is sufficiently low.

The constant current source 110 uses a high gain differential amplifier to compare a reference Zener 119 voltage to the voltage generated by the constant current $I_{cs}$ flowing through resistors 100 and 121. A departure of the constant current from the desired $I_{cs}$ results in different voltages on the bases of transistors 111 and 112. These transistors produce a differential amplifier effect. When the resulting collector currents differ, transistor 114 produces a corrective feedback action which adjusts the base bias on transistor 112.

As an example, the following component values and types are given as representative:

| | | |
|---|---|---|
| Resistor **23** | KΩ | 100 |
| Resistor **63** | KΩ | 47 |
| Resistor **73** | KΩ | 27 |
| Resistor **74** | MΩ | 10 |
| Resistor **75** | Ω | 700 |
| Resistor **76** | Ω | 700 |
| Resistor **83** | KΩ | 15 |
| Resistor **85** | Ω | 845 |
| Resistor **86** | Ω | 845 |
| Resistor **100** | Ω | 100 |
| Resistor **101** | KΩ | 1.5 |
| Resistor **103** | KΩ | 1.5 |
| Resistor **104** | KΩ | 1.5 |
| Resistor **112** | KΩ | 30 |
| Resistor **115** | Ω | 220 |
| Resistor **116** | KΩ | 27 |
| Resistor **120** | KΩ | 3 |
| Resistor **121** | KΩ | 1.5 |
| Zener diode **119** | | IN825A |
| Remaining diodes | | IN3064 |
| Capacitor **102** | μf | 200 |
| Capacitor **105** | μf | 200 |
| Capacitor **117** | μf | 500 |
| Transistor **114** | | 2N3486A |
| Remaining (dual) transistors | | 2N2920 |

In practice, excellent speed and temperature stability has been achieved. It has been found possible to obtain precision operation of the dividers and switches over temperature ranges on the order of 200° F. and data conversions can be readily made at standard digital data processing rates.

While only certain preferred features of the invention have been shown by way of illustration, many modifications and changes will occur to those skilled in the art. For example, the converter can employ current dividers with more than two branches with nonbinary inputs. It is, therefore, to be understood that the appended claims are intended to cover all such modifications and changes as fall within the true spirit and scope of the invention.

What is claimed is:

1. A digital-to-analog converter for converting a set of binary signals representing a variable quantity to an analog signal proportional thereto, comprising:

(a) a source of constant current;

(b) a first pair of active devices connected in parallel with each other and in series with said source for dividing said constant current into two equal currents;

(c) a second pair of active devices, connected in parallel with each other and in series with one device of said first pair of active devices and responsive to one said equal current for dividing that one of said two equal currents into two currents which are equal to each other;

(d) switching means, responsive to input binary signals, for selectively summing said currents from said pairs of active devices to provide finite currents corresponding to said binary signals;

(e) resistance means responsive to said switching means for converting said finite currents into discrete voltages proportional to said binary signals.

2. The digital-to-analog converter of claim 1 further comprising:

(f) additional pairs of active devices cascaded as current dividers in the same manner as said first and second pairs of active devices to provide higher binary subdivisions of said constant current.

3. The digital-to-analog converter of claim 2 wherein said pairs of active devices are emitter-coupled transistors producing said binary subdivisions of said constant current at the collectors of said transistors.

4. The digital-to-analog converter of claim 1 wherein said active devices are solid state active devices.

5. The digital-to-analog converter of claim 4 wherein said switching means are solid state devices.

6. The digital-to-analog converter of claim 1 wherein said pairs of active devices are emitter-coupled transistors producing said equal currents and said currents which are equal to each other at the collectors of said transistors.

7. A digital-to-analog signal converter comprising:

(a) a source of constant current;

(b) an operational D-C amplifier for summing currents;

(c) a first pair of emitter-coupled transistors for dividing the constant current into two equal collector currents;

(d) a first current switch for selectively connecting one of the collector currents from said first pair of transistors to said operational amplifier in accordance with an input bit signal;

(e) a second pair of emitter-coupled transistors for dividing the remaining collector current from said first pair of transistors into two equal collector currents;

(f) a second current switch for selectively connecting one of the collector currents from said second pair of transistors to said operational amplifier in accordance with a second input bit signal;

(g) a plurality of additional pairs of emitter-coupled transistors and a plurality of corresponding additional current switches for subdividing the remaining collector current from said second pair of transistors and selectively applying respective collector currents to said operational amplifier in the same manner as said transistors and switches of elements (c)–(f);

(h) a resistor connected in the feedback loop of said operational amplifier in such a manner that the current balancing the summed input currents passes therethrough and generates an output voltage which is linearly proportional to the input binary signal.

8. The digital-to-analog signal converter of claim 7 further comprising:

(i) means connecting together the bases of each of said pairs of transistors.

9. The digital-to-analog signal converter of claim 7 further comprising:

(i) said current switches consisting of a first diode series connected for passing current from one of said dividers to said operational amplifier and a second diode connected in parallel with said first diode for passing the divider current to the source of input bit signals for one of the bit signal levels.

10. The digital-to-analog signal converter of claim 7 further comprising:

(i) a set of series connected diodes for providing bias voltages for the bases of said transistors.

References Cited

UNITED STATES PATENTS

| | | | |
|---|---|---|---|
| 3,021,518 | 2/1962 | Kliman et al. | 340—347 |
| 3,098,221 | 7/1963 | Propster | 340—347 |
| 3,353,174 | 11/1967 | Lang | 340—347 |

MAYNARD R. WILBUR, Primary Examiner

JEREMIAH GLASSMAN, Assistant Examiner

U.S. Cl. X.R.

307—241